US010756472B2

(12) United States Patent
Lim et al.

(10) Patent No.: US 10,756,472 B2
(45) Date of Patent: Aug. 25, 2020

(54) FUNCTIONAL CONTACTOR AND PORTABLE ELECTRONIC DEVICE COMPRISING SAME

(71) Applicant: AMOTECH CO., LTD., Incheon (KR)

(72) Inventors: Byung Guk Lim, Incheon (KR); Seong Ha Lee, Incheon (KR); Dong Hun Kong, Incheon (KR)

(73) Assignee: AMOTECH CO., LTD., Incheon (KR)

( * ) Notice: Subject to any disclaimer, the term of this patent is extended or adjusted under 35 U.S.C. 154(b) by 204 days.

(21) Appl. No.: 16/079,834

(22) PCT Filed: Feb. 24, 2017

(86) PCT No.: PCT/KR2017/002051
§ 371 (c)(1),
(2) Date: Aug. 24, 2018

(87) PCT Pub. No.: WO2017/146517
PCT Pub. Date: Aug. 31, 2017

(65) Prior Publication Data
US 2020/0212614 A1    Jul. 2, 2020

(30) Foreign Application Priority Data
Feb. 26, 2016  (KR) .................. 10-2016-0023567
Feb. 24, 2017  (KR) .................. 10-2017-0024466

(51) Int. Cl.
*H01R 13/24*    (2006.01)
*H01R 13/648*   (2006.01)
(Continued)

(52) U.S. Cl.
CPC ..... *H01R 13/2407* (2013.01); *H01R 13/6485* (2013.01); *H05K 1/0268* (2013.01); *H05K 9/0016* (2013.01); *H05K 2201/1031* (2013.01)

(58) Field of Classification Search
CPC .............. H01R 23/722; H01R 13/2414; H01R 13/6616; H01R 13/6485;
(Continued)

(56) References Cited

U.S. PATENT DOCUMENTS 6,293,806 B1    9/2001  Yu
6,555,764 B1    4/2003  Maruyama et al.
(Continued)

FOREIGN PATENT DOCUMENTS

JP  05-090978    12/1993
KR  10-0753187    8/2007
(Continued)

OTHER PUBLICATIONS

International Search Report Issued in Corresponding PCT Application No. PCT/KR2017/002051, dated Jun. 9, 2017.
(Continued)

*Primary Examiner* — Gary F Paumen
(74) *Attorney, Agent, or Firm* — Norton Rose Fulbright US LLP

(57) ABSTRACT

Provided are a functional contactor and a portable electronic device comprising same. A functional contactor, according to an embodiment of the present invention, comprises: an elastic conductor which electrically comes in contact with a conductor of an electronic device; a functional element which is connected to the elastic conductor and has a first electrode and a second electrode on at least one part of the lower side and the upper side, respectively; a first testing electrode which is connected to the first electrode and is provided on the upper side of the functional element and a fixed distance away from the second electrode; and a second testing electrode which is connected to the second electrode and is provided on the upper side of the functional element.

15 Claims, 6 Drawing Sheets

(51) Int. Cl.
*H05K 1/02* (2006.01)
*H05K 9/00* (2006.01)

(58) Field of Classification Search
CPC ...... H01R 13/66–6691; H01R 13/2407; H01R 9/096; H01R 9/2041; H02H 9/02; H05K 1/0268; H05K 9/0016; H05K 2201/1031
USPC .......................... 439/66, 91, 620.01–620.25
See application file for complete search history.

(56) References Cited

U.S. PATENT DOCUMENTS

| | | | | |
|---|---|---|---|---|
| 8,784,146 B2* | 7/2014 | Yang | ...................... | H01R 12/58 439/862 |
| 9,240,645 B1* | 1/2016 | Ma | ...................... | H01R 13/2492 |
| 9,590,326 B2* | 3/2017 | Yang | ...................... | H01R 12/58 |
| 9,759,742 B2* | 9/2017 | Lee | ...................... | G01R 1/0433 |
| 10,188,019 B2* | 1/2019 | Hwang | ............. | H01R 13/6666 |
| 2008/0100519 A1* | 5/2008 | Ku | ...................... | H01Q 9/0421 343/702 |
| 2010/0254052 A1* | 10/2010 | Katsumura | ............... | H01T 4/12 361/56 |
| 2013/0057994 A1* | 3/2013 | Youn | ...................... | H02H 9/026 361/56 |
| 2013/0059486 A1* | 3/2013 | Yang | ...................... | H01R 12/55 439/884 |
| 2014/0146992 A1 | 5/2014 | Jun et al. | | |
| 2014/0302730 A1* | 10/2014 | Yang | ...................... | H01R 12/55 439/884 |
| 2015/0153387 A1* | 6/2015 | Lee | ...................... | G01R 1/0466 324/756.02 |
| 2017/0005464 A1* | 1/2017 | Hwang | ...................... | H01C 7/12 |
| 2019/0097363 A1* | 3/2019 | Cho | ........................ | H01G 2/14 |
| 2019/0190167 A1 | 6/2019 | Choi et al. | | |
| 2019/0207386 A1* | 7/2019 | Wang | ...................... | H02H 9/005 |
| 2019/0281689 A1 | 9/2019 | Lim | | |
| 2019/0304636 A1* | 10/2019 | Kirk | ........................ | H02H 9/02 |
| 2019/0320561 A1* | 10/2019 | Lim | ...................... | H01R 13/24 |
| 2020/0021051 A1* | 1/2020 | Lim | .................. | H01R 12/7076 |

FOREIGN PATENT DOCUMENTS

| | | |
|---|---|---|
| KR | 10-2007-0109332 | 2/2008 |
| KR | 10-1033990 | 5/2011 |
| KR | 10-2013-0026735 | 3/2013 |
| KR | 10-1339166 | 12/2013 |
| KR | 10-2011-0133502 | 12/2014 |
| KR | 10-1556936 | 10/2015 |
| KR | 101585604 | 1/2016 |
| KR | 1638053 | 7/2016 |
| WO | WO 2017/146435 | 8/2017 |

OTHER PUBLICATIONS

International Search Report Issued in Corresponding PCT Application No. PCT/KR2017/001873, dated May 31, 2017.

* cited by examiner

FUNCTIONAL CONTACTOR AND PORTABLE ELECTRONIC DEVICE COMPRISING SAME

CROSS-REFERENCE TO RELATED APPLICATIONS

This application is a national phase application under 35 U.S.C. § 371 of International Application No. PCT/KR2017/002051, filed Feb. 24, 2017, which claims priority to and the benefit of Korean Patent Applications No. 10-2016-0023567, filed Feb. 26, 2016, and No. 10-2017-0024466, filed Feb. 24, 2017. The contents of each of the referenced patent applications are incorporated into the present application by reference.

FIELD OF THE DISCLOSURE

The present invention relates to a contactor for an electronic device such as a smart phone, and more specifically, to a functional contactor capable of confirming an electrical connection of a contactor and implementing at least one of an electrostatic discharge (ESD) protection function, an electric shock prevention function, and a communication signal bypass function in addition to an inherent function of the contactor, and a portable electronic device including the functional contactor.

DESCRIPTION OF RELATED ART

Recently, various components are densely arranged inside of a portable electronic device in accordance with the trend of miniaturization and multi-functionalization. Such a portable electronic device includes a conductive gasket provided between an external housing and an internal circuit board of the portable electronic device to attenuate an impact from the outside and to reduce electromagnetic waves penetrating into or propagated from the portable electronic device.

As portable electronic devices are equipped to be multi-functional, a plurality of antennas are provided in portable electronic devices to implement multi-functionality, and some of the antennas are internal antennas which may be disposed in an external housing of portable electronic devices. Thus, a conductive contactor is used for an electrical contact between the antenna disposed in the external housing and an internal circuit board of the portable electronic device.

In addition, recently, housings formed of metals are increasingly used for portable electronic devices to improve aesthetics and robustness of the portable electronic devices.

However, since an electrical path may be formed between the external housing and the internal circuit board due to the conductive gasket or the conductive contactor, especially, since the metal housing and the circuit board form a loop, when static electricity having a high voltage is suddenly introduced through a conductor such as the external metal housing, the static electricity may be introduced into the internal circuit board through the conductive gasket or the conductive contactor, thereby causing damage to a circuit such as an integrated circuit (IC).

In general, the portable electronic device uses a charger to charge a battery. Such a charger rectifies an external alternating current (AC) power to a direct current (DC) power and then converts the DC power to a low DC power suitable for the portable electronic device through a transformer. In this case, in order to enhance the electrical insulation of the transformer, a Y capacitor (Y-CAP) composed of a capacitor is provided at both ends of the transformer.

However, when the Y-CAP has abnormal characteristics, such as an inauthentic charger, the DC power may not be sufficiently blocked by the Y-CAP. Further, a leakage current may be generated by the AC power and the leakage current may flow along a ground portion of a circuit.

The leakage current may be transmitted to a conductor which may come into contact with a human body, such as an external case of a portable electronic device, so that a user may feel an uncomfortable feeling of electricity or, in a severe case, an electric shock accident causing injury to the user may occur.

Therefore, it is necessary to provide a protective element for protecting the user from the leakage current in the conductive gasket or the conductive contactor connecting the metal housing and the circuit board.

Further, when the metal housing is used as an antenna, the conductive gasket or the conductive contactor is required to have a high capacitance because a signal attenuation that interrupts a radio frequency (RF) signal transmission may occur when the capacitance is low.

When a conductor such as a metal case is used, there is a need to provide a contactor having various functions of protecting the user or circuits in a portable electronic device in addition to a function of acting as a simple electrical contact.

In addition, when a component provided in the form of a single module is installed in a portable electronic device, the electrical connection failure may occur at connection portions between functional units constituting the single module and between the single module and the portable electronic device. Thus, there is a need to check the electrical connection between the contactor and the portable electronic device.

SUMMARY OF THE INVENTION

The present invention has been made in view of the above-mentioned problems, and it is an object of the present invention to provide a functional contactor having various functions in addition to an inherent function thereof to realize various functions as described above and to easily check the electrical connection of a contactor without increasing the number of components or increasing the size of an electronic device, and a portable electronic device having the functional contactor.

In order to achieve the above-mentioned object, the present invention provides a functional contactor including: an elastic conductor configured to come into electrical contact with a conductor of an electronic device; a functional element connected to the elastic conductor and having a first electrode and a second electrode on at least a portion of a lower surface and an upper surface thereof, respectively; a first test electrode connected to the first electrode and spaced apart from the second electrode by a predetermined distance on the upper surface of the functional element; and a second test electrode connected to the second electrode and provided on the upper surface of the functional element.

According to an exemplary embodiment of the present invention, the functional contactor may further include a via hole which perpendicularly passes through the functional element and through which the first test electrode and the first electrode are connected; and a conductive material which fills the via hole.

In addition, the functional contactor may further include a connection portion provided on at least a portion of a side surface of the functional element to connect the first test electrode and the first electrode.

As an example, the connection portion may be provided in the form of a castellation or an electrode.

As another example, the connection portion may be integrally formed with the first test electrode.

In this case, the connection portion in the form of the electrode may be provided on all of both sides of the functional element, and the first test electrode may be provided symmetrically on both sides of the second electrode on the upper surface of the functional element.

Further, the second test electrode may be at least a portion of the second electrode.

In addition, the elastic conductor may be laminated on the second electrode through a conductive adhesive layer or a solder.

Further, the functional element may be coupled to a receiving portion of the conductor of the electronic device through a conductive adhesive layer.

The elastic conductor may include one of a conductive gasket, a silicone rubber pad, and a C-clip.

The functional element may have at least one of an electric shock prevention function for blocking a leakage current of an external power source introduced from a ground of a circuit board of the electronic device, a communication signal transmission function for transmitting a communication signal introduced from the conductor or the circuit board of the electronic device, and an electrostatic discharge (ESD) protection function for discharging static electricity introduced from the conductor of the electronic device.

According to another aspect of the present invention, there is provided a portable electronic device including: an external conductor contactable with a human body; an internal conductor; and the functional contactor as described above, wherein the functional contactor is coupled to one of the external conductor and the internal conductor and is connected in series between the external conductor and the internal conductor.

According to an exemplary embodiment of the present invention, one of the external conductor and the internal conductor coupled to the functional contactor may include a receiving portion for receiving the functional contactor.

In this case, the external conductor may include one of an antenna for making communication between the electronic device and an external device, a metal case, and a conductive accessory.

In addition, the internal conductor may include a conductive bracket or a circuit board.

A functional contactor and a portable electronic device including the functional contactor according to an embodiment of the present invention can include the test electrode formed on an upper surface of a functional element, on which the contactor is laminated, and connected to the lower surface of the functional element, so the electrical connection state can be easily confirmed. Thus, the possibility of failure occurring in the manufacturing process can be easily checked so that the failure rate of the products can be reduced.

Further, according to the present invention, in the portable electronic device, in which an external conductor such as a metal case is exposed to the outside, the functional element is provided in the contactor to connect the external conductor and an internal conductor connected to a circuit board so that the user can be protected from a leakage current generated from an external power source, and the internal circuit can be protected from static electricity.

In addition, the present invention has an advantage that the functional element has a high capacitance so that the attenuation of a communication signal can be minimized when transmitting the communication signal.

DETAILED DESCRIPTION OF THE INVENTION

Figure 1:
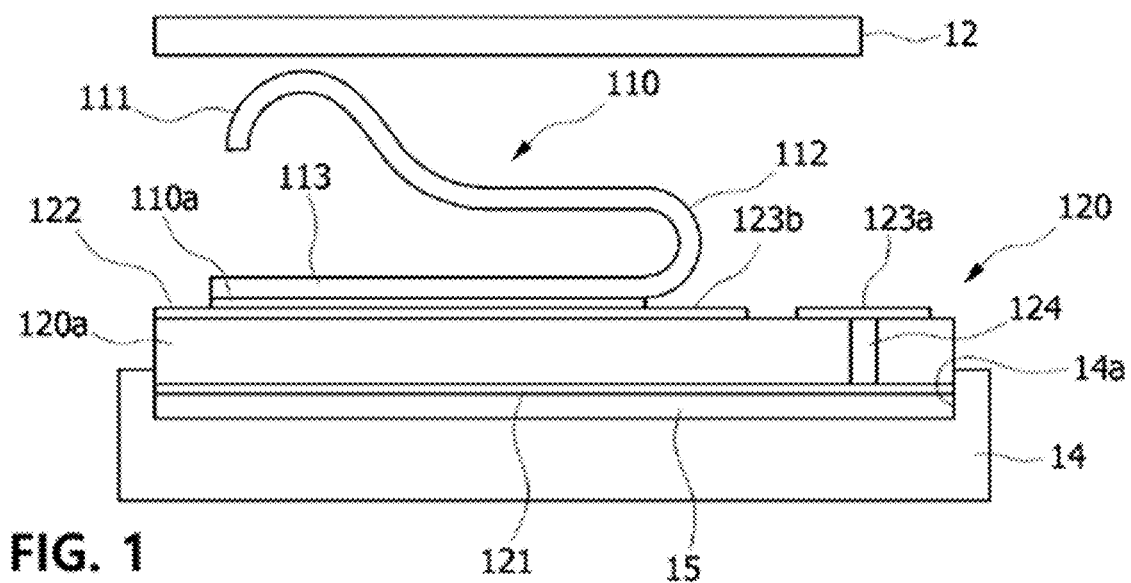
FIG. 1 is a sectional view illustrating an example of a functional contactor applied to a portable electronic device according to an embodiment of the present invention.

Hereinafter, exemplary embodiments of the present invention will be described in detail with reference to the accompanying drawings such that those skilled in the art may easily implement the present invention. The present invention may be implemented in various forms and is not limited to the embodiments described herein. In the drawings, elements that do not relate to the present invention are omitted for clarifying the present invention, and the same reference numerals are assigned to the same or similar components throughout the specification.

Figure 2:
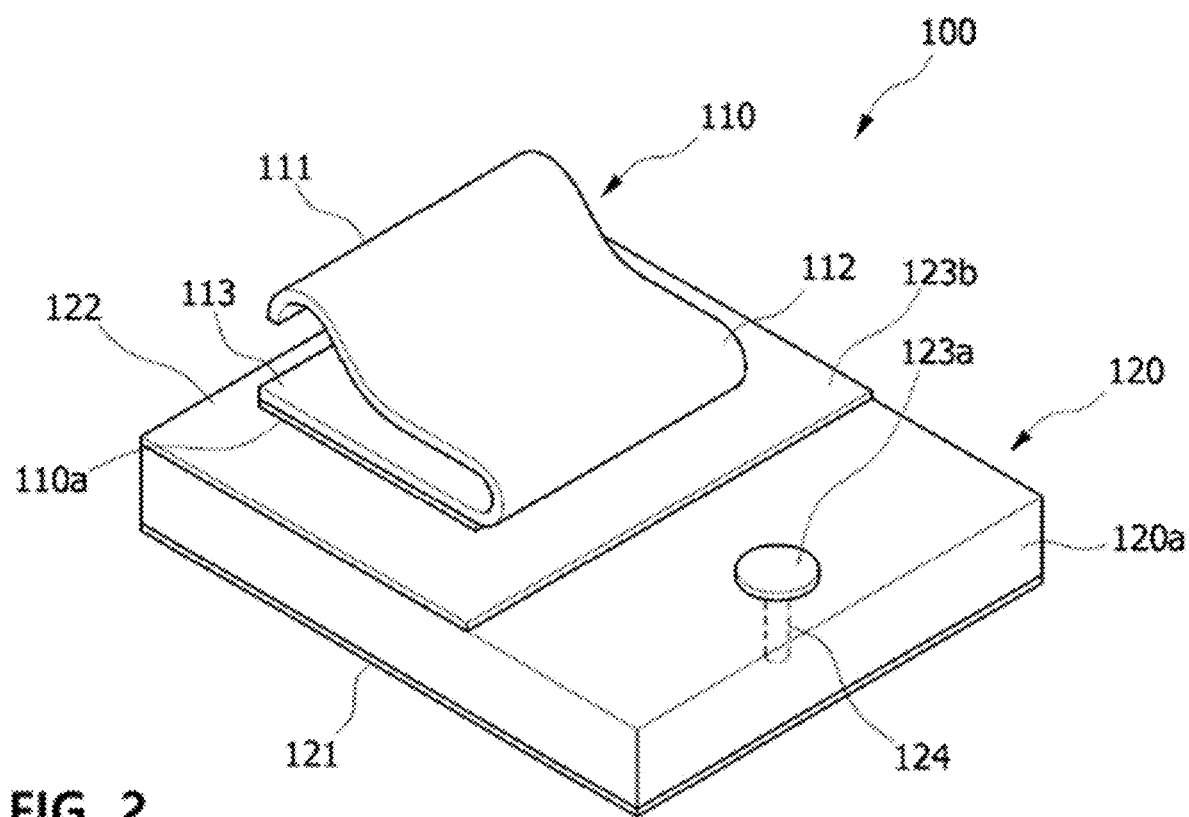
FIG. 2 is a perspective view illustrating an example of a functional contactor according to an embodiment of the present invention.

A functional contactor 100 according to an embodiment of the present invention includes an elastic conductor 110 and a functional element 120, as shown in FIGS. 1 and 2.

In a portable electronic device, the functional contactor 100 electrically connects an external conductor 14, such as an external metal case, to an internal conductor 12, such as a circuit board or bracket. When the internal conductor 12 is a conductive bracket, the conductive bracket may be formed of a conductive material, for example, magnesium (Mg). Accordingly, the circuit board may be electrically connected to the conductive bracket.

In this case, the functional contactor 100 is coupled to one of the external conductor 14 and the internal conductor 12 and is electrically connected to the other thereof. That is, the functional contactor 100 may be configured such that the elastic conductor 110 is in contact with the internal conductor 12, and the functional element 120 is coupled to the external conductor 14. Otherwise, the elastic conductor 110 may come into contact with the external conductor 14, and the functional element 120 may be coupled to the internal conductor 12.

As an example, when the functional contactor 100 is in an adhesive layer type, that is, when the functional contactor 100 is coupled by a conductive adhesive layer, the functional element 120 may be coupled to the external conductor 14. The external conductor 14 may be provided with a receiving portion 14a for receiving the functional contactor 100 on a surface facing the internal conductor 12.

In this case, the functional contactor 100 may be coupled to the receiving portion 14a through a conductive adhesive layer 15. For example, the conductive adhesive layer may be a conductive adhesive film.

As described above, since the functional contactor 100 is coupled to the external conductor 14 through the conductive adhesive layer 15, the functional contactor 100 may be applied to a position where connection by soldering is not easy, that is, a position where connection to the circuit board is difficult, so that the degree of freedom in design can be improved.

Thus, a manufacturing cost can be reduced by omitting a separate medium such as a flexible printed circuit board (FPCB) that can be mounted by soldering, and the electrical characteristics can be improved by eliminating performance degradation factors caused by degradation of the medium.

As another example, when the functional contactor 100 is in a surface mount technology (SMT) type, that is, when the functional contactor 100 is coupled through soldering, the functional element 120 can be coupled to the circuit board.

Although the contactor 100 coupled to the external conductor 14 is shown in FIG. 1, the present invention is not limited thereto and the contactor 100 may be coupled to the internal conductor 12. In the following description, the contactor 100 will be described as being coupled to the external conductor 14, but it will be appreciated that the contactor 100 may be coupled to the external conductor 12 as well. That is, the internal conductor 14 and the external conductor 12 may be construed to have a contrary concept depending on a coupling position of the contactor 100.

Meanwhile, the portable electronic device may be in the form of a portable electronic appliance which is portable and easily carried. For example, the portable electronic device may be a portable terminal, such as a smart phone, a cellular phone, or the like, and may be a smart watch, a digital camera, a digital multimedia broadcasting (DMB), an electronic book, a netbook, a tablet personal computer (PC), a portable computer, or the like. Such electronic devices may include any suitable electronic components including antenna structures for making communication with external devices. In addition, the portable electronic device may be an appliance using short-range network communication such as Wi-Fi or Bluetooth.

The external conductor 14 may be provided, for example, to partially surround or entirely surround a side portion of the portable electronic device and may be an antenna or a conductive accessory for making communication between the portable electronic device and an external device.

The elastic conductor 110 may have elasticity while making electrical contact with the conductor 12 or 14 of the electronic device. The elastic conductor 110 may be a conductive gasket, a silicone rubber pad, or a clip-shaped conductor having elasticity.

When the elastic conductor 110 is a clip-shaped conductor having elasticity, the clip-shaped conductor may be a C-clip having a substantially "C" shape.

The C-clip 110 may include a contact portion 111, a bent portion 112, and a terminal portion 113.

The contact portion 111 has a curved shape and may come into electrical contact with the internal conductor 12. The bent portion 112 extends from the contact portion 111 and may have elasticity. The terminal portion 113 may include a terminal electrically connected to the functional element 120.

The contact portion 111, the bent portion 112, and the terminal portion 113 may be integrally formed using a conductive material having elasticity.

When the C-clip 110 comes into contact with the internal conductor 12, the contact portion 111 of the C-clip 110 is pressed by the internal conductor 12, so the bent portion 112 having the elasticity is pressed toward the external conductor 14. When the external conductor 14 is separated from the internal conductor 12, the bent portion 112 is restored to its original state due to the elasticity thereof.

Meanwhile, when the elastic conductor 110 comes into contact with the internal conductor 12, a galvanic corrosion may occur due to a potential difference between the heterogeneous metals. In this case, in order to minimize the galvanic corrosion, a contact area of the elastic conductor 110 with respect to the internal conductor 12 may be minimized as much as possible. That is, the elastic conductor 110 may be configured to make a line-contact and/or a point-contact, rather than a surface-contact, with the internal conductor 12.

For example, since the C-clip 110 is in line-contact or point-contact with the internal conductor 12, galvanic corrosion resistance may be high.

The functional element 120 may be electrically connected in series to the elastic conductor 110 and, for example, may be laminated with the elastic conductor 110.

As described above, since the elastic conductor 110 and the functional element 120 are provided integrally, an additional space, which is required when separately arranging the elastic conductor 110 and the functional element 120, is not required so that the portable electronic device can be minimized.

The functional element 120 includes a first electrode 121 and a second electrode 122.

The first electrode 121 is provided on a lower surface of a body 120a and is coupled to the external conductor 14 through the conductive adhesive layer 15. The first electrode 121 may be provided on the entire lower surface of the body 120a (see FIG. 1).

The second electrode 122 is provided on a part of an upper surface of the body 120a and the elastic conductor 110 is laminated through a conductive adhesive layer or a solder 110a. The second electrode 122 may have a size larger than or equal to an area of the lower surface of the elastic conductor 110, that is, an area of the terminal portion 113 (see FIG. 2).

When the functional contactor 100 is coupled to the external conductor 14, it is necessary to check a connection between the functional contactor 100 and the external conductor 14 and a connection between the elastic conductor 110 and the functional element 120 in the functional contactor 100 in order to reduce the failure rate of the products.

To this end, the functional contactor 100 includes a first test electrode 123a and a second test electrode 123b.

The first test electrode 123a is spaced apart from the second electrode 122 by a predetermined distance on the upper surface of the functional element 120. The first test electrode 123a is connected to the first electrode 121 in order to test whether the first electrode 121 is normally connected to the external conductor 14 through the conductive adhesive layer 15.

That is, the first test electrode 123a is used to test the connection at the lower portion on the basis of the functional element 120. In this case, the connection between the external conductor 14 and the first electrode 121 may be tested by checking the resistance between the internal conductor 12 and the first test electrode 123a.

In addition, the second test electrode 123b is provided on the upper surface of the functional element 120. The second test electrode 123b is connected to the second electrode 122 in order to test whether the elastic conductor 110 is normally connected to the second electrode 122 through the conductive adhesive layer or the solder 110a.

That is, the second test electrode 123b is used to test the connection at the upper portion on the basis of the functional element 120. In this case, the connection between the elastic conductor 110 and the second electrode 122 can be tested by checking the resistance of the upper portion of the elastic conductor 110, for example, the resistance between the contact portion 111 and the second test electrode 123b.

As shown in FIGS. 1 and 2, the second test electrode 123b may be at least a part of the second electrode. That is, the second test electrode 123b is not separately provided, but may be provided as a part of the second electrode 122 which is larger than an area of the lower surface of the elastic conductor 110.

Figure 3:
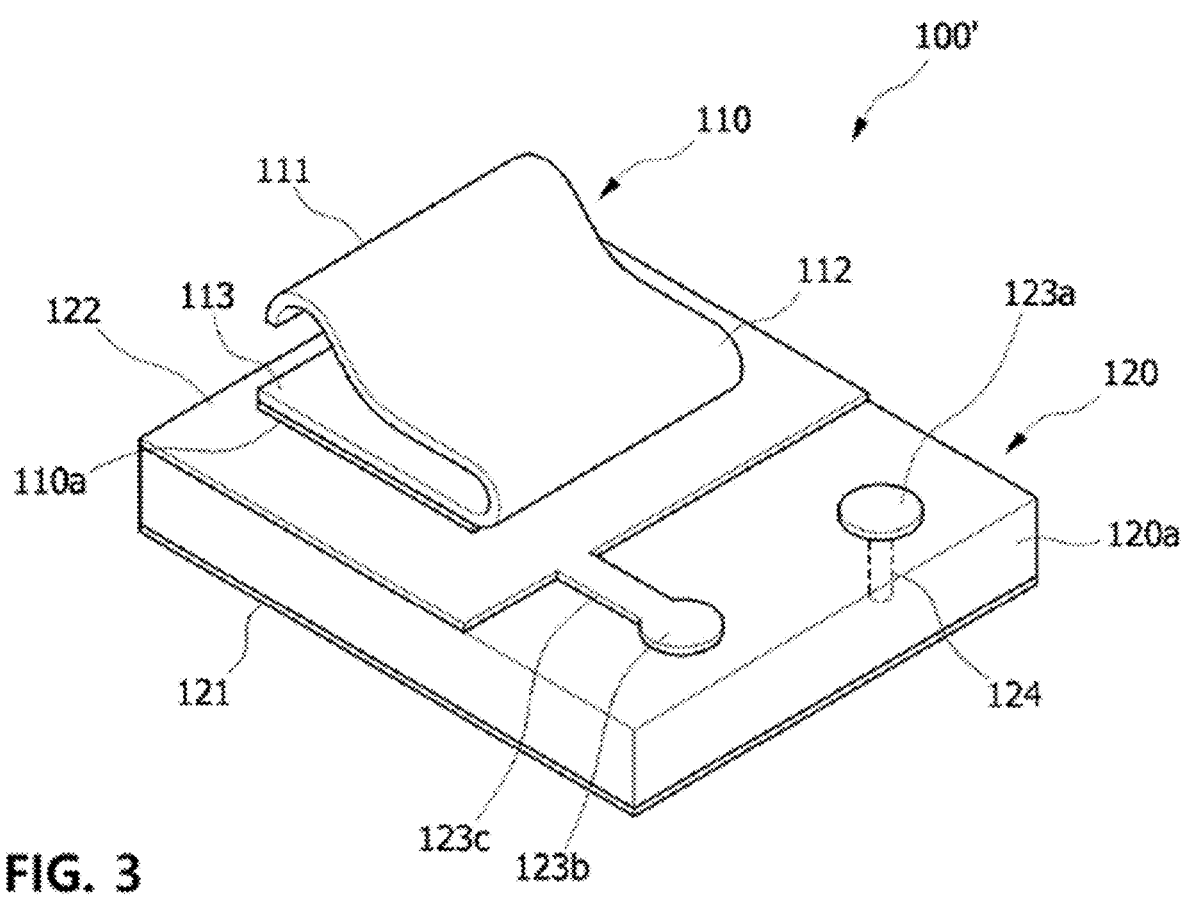
FIG. 3 is a perspective view illustrating another example of the functional contactor according to the embodiment of the present invention.

Alternatively, the second test electrode 123b may be separately provided as shown in FIG. 3. In this case, the functional contactor 100' may be connected to the second electrode 122 by an extension portion 123c of the second test electrode 123b.

For example, when the second electrode 122 cannot be used as an electrode for test because the second electrode 122 has a size substantially identical to an area of the lower surface of the elastic conductor 110, the second test electrode 123b may be provided separately from the second electrode 122.

The first test electrode 123a may be variously formed on the upper surface of the functional element 120 according to the structure of the second test electrode 123b. For example, when the second test electrode 123b is integrally formed with the second electrode 122, the first test electrode 123a may be formed on a substantially central portion of the functional element 120 in the width direction of the functional element 120 (see FIG. 2).

In addition, when the second test electrode 123b is provided separately from the second electrode 122, the first test electrode 123a may be spaced apart from the second test electrode 123b. For example, the first test electrode 123a may be moved to one side on the upper surface of the functional element 120 to be symmetrical to the second test electrode 123b (see FIG. 3).

As described above, the electrical connection between the elastic conductor 110 and the functional element 120 and the electrical connection between the functional element 120 and the external conductor 114 can be easily tested using the first test electrode 123a and the second test electrode 123b so that the possibility of failure occurring in the manufacturing process due to the defective coupling or the degradation of the characteristics of the conductive adhesive layer 115 or the solder 110a can be easily detected, thereby lowering the failure rate of the products.

In the functional contactors 100a, 100b, and 100c, the first test electrode 123a and the first electrode 121 may be connected in various forms. That is, the first test electrode 123a may be connected to the first electrode 121 by connection portions 124a and 124b provided on at least a portion of a side surface of the functional element 120.

Figure 4:
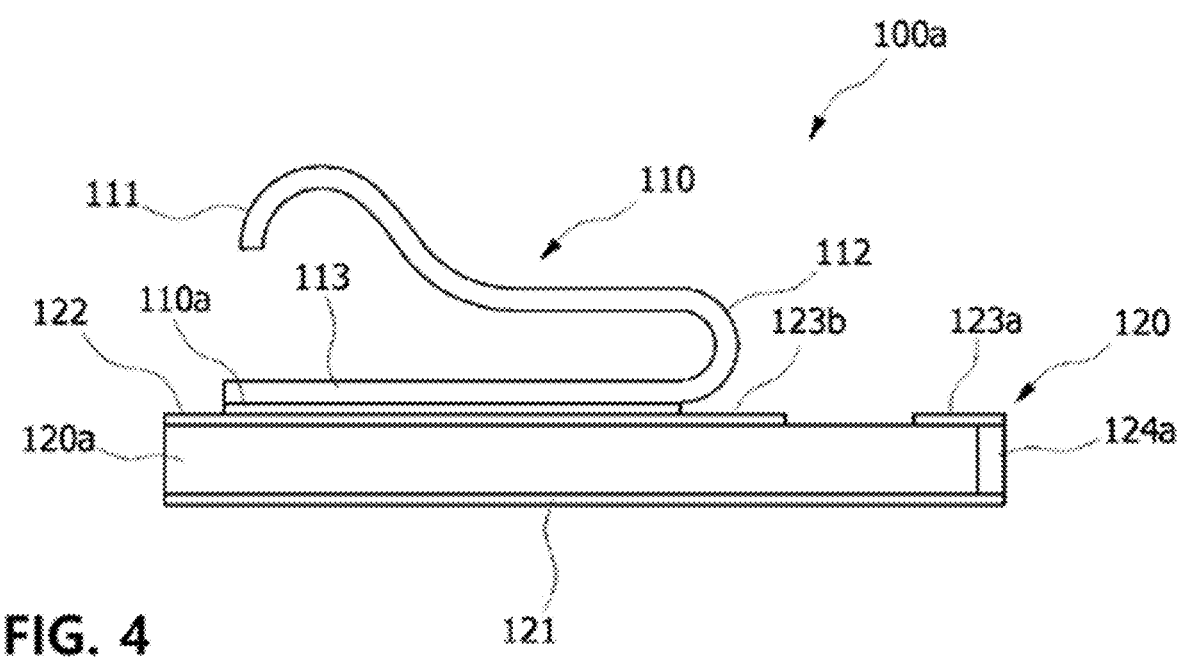
FIG. 4 is a sectional view of the functional contactor according to the embodiment of the present invention in which a connection portion is provided in the form of a castellation.
Figure 5:
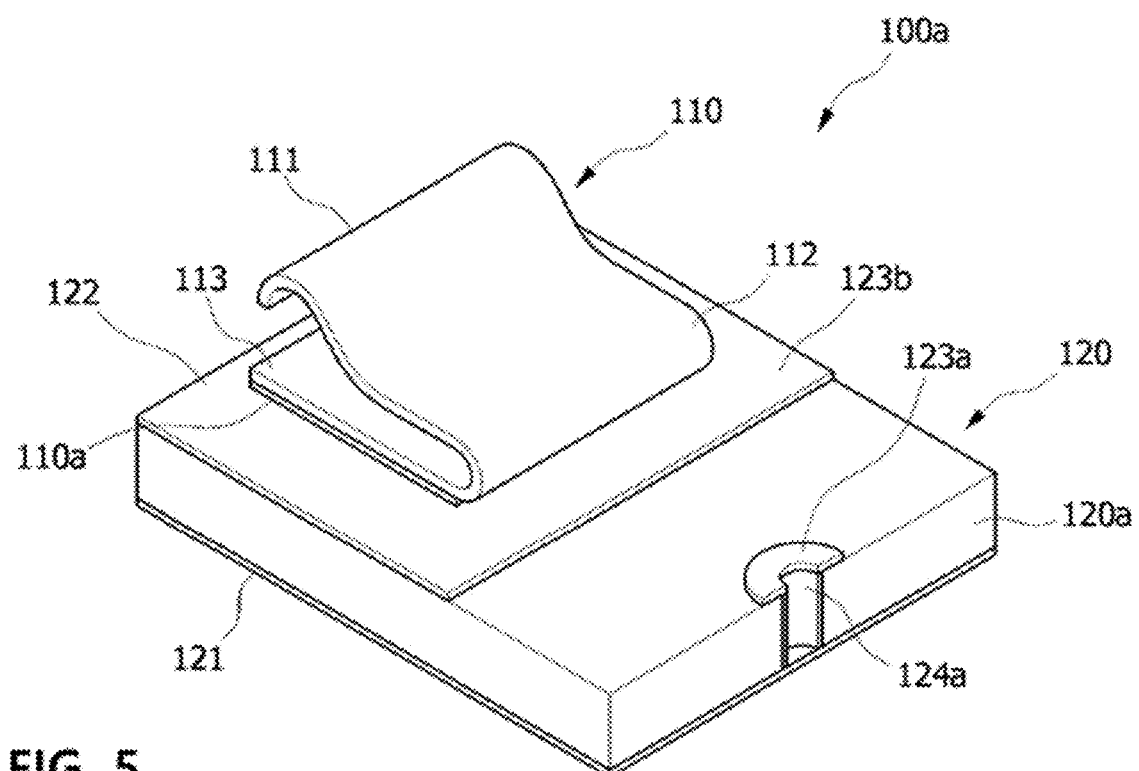
FIG. 5 is a perspective view of FIG. 4.

For example, as shown in FIGS. 4 and 5, the functional contactor 100a may be configured such that the connection portion 124a is provided in the form of a castellation at a substantially central portion on the side surface of the functional element 120. That is, a semicircular groove is formed in the side surface of the functional element 120 and a conductive material fills the semicircular groove so that the connection portion 124a may be formed.

In this case, the first test electrode 123a may be connected to the semicircular groove and may be configured as a semicircular ring. In addition, the first test electrode 123a may be integrally formed with the connection portion 124a.

Figure 6:
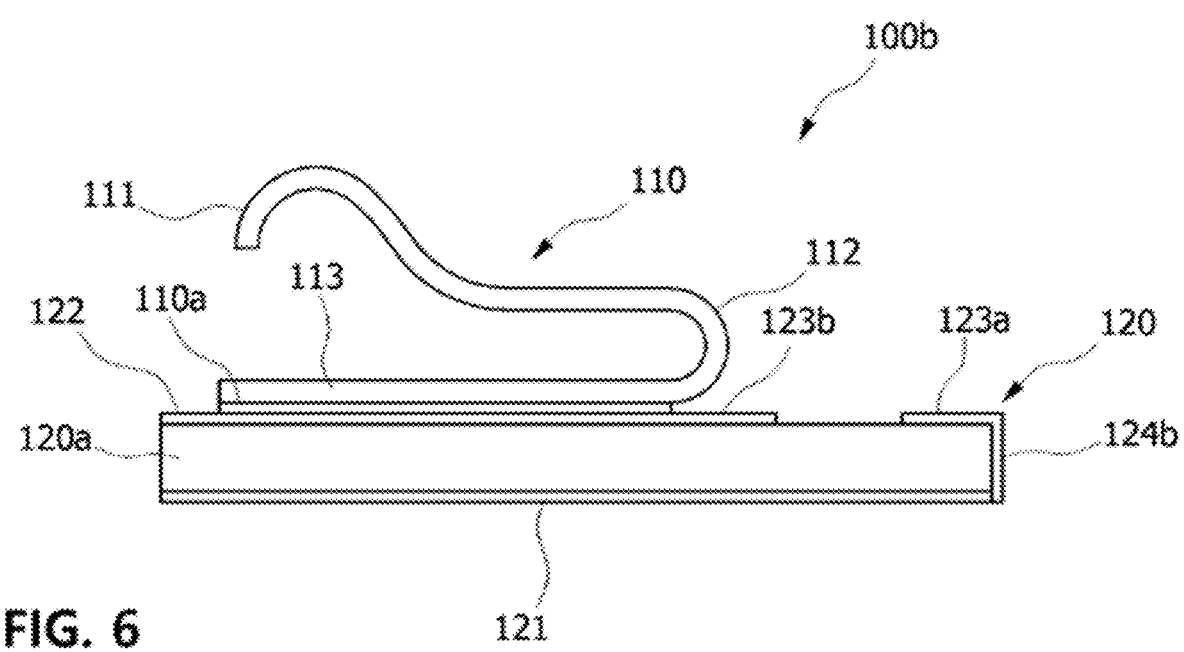
FIG. 6 is a sectional view of the functional contactor according to the embodiment of the present invention, in which a connection portion is provided in the form of an electrode.
Figure 7:
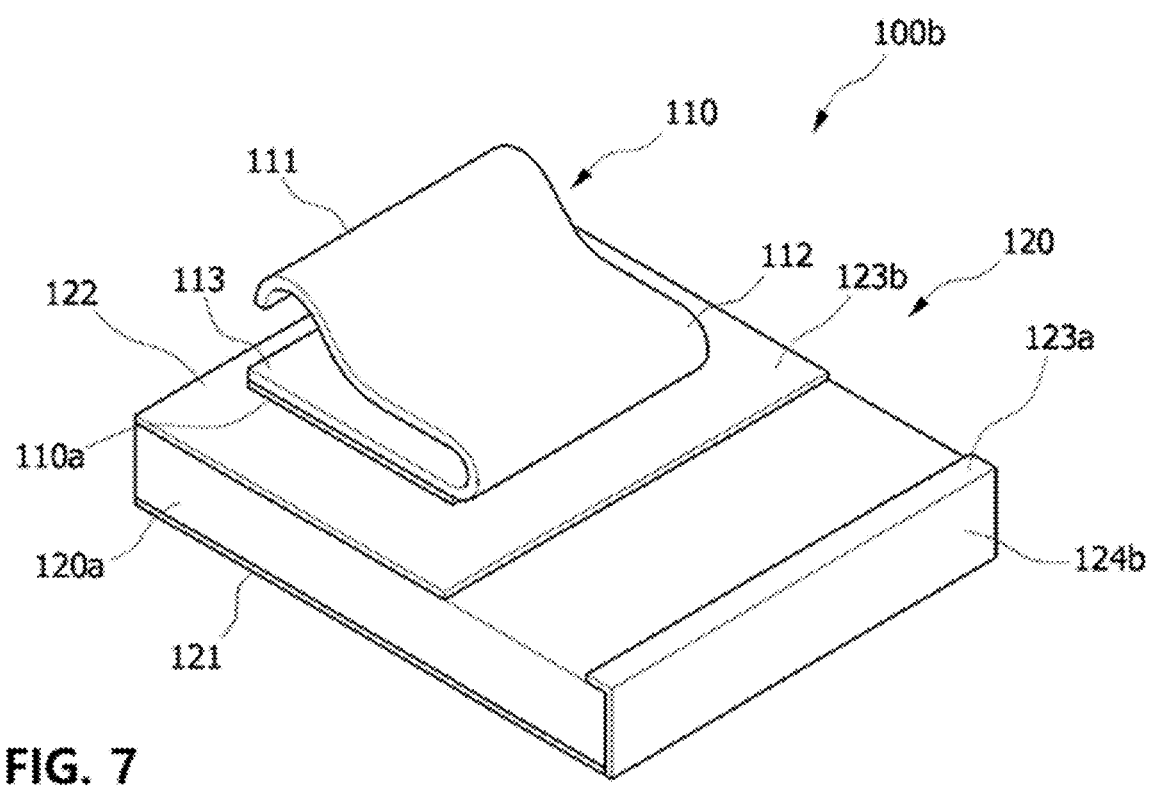
FIG. 7 is a perspective view of FIG. 6.

As shown in FIGS. 6 and 7, the functional contactor 100b may include the connection portion 124b in the form of an electrode provided on the entire side surface of the functional element 120. In this case, the first test electrode 123a may be integrally formed with the connection portion 124b and, alternatively, integrally formed with the first electrode 121.

That is, the first test electrode 123a and the connection portion 124b may be provided as a termination type side electrode on the side surface of the functional element 120. In this case, the second test electrode 123b may be provided integrally with the second electrode 122 without being separately provided in order to ensure a sufficient distance with respect to the first test electrode 123a.

Figure 8:
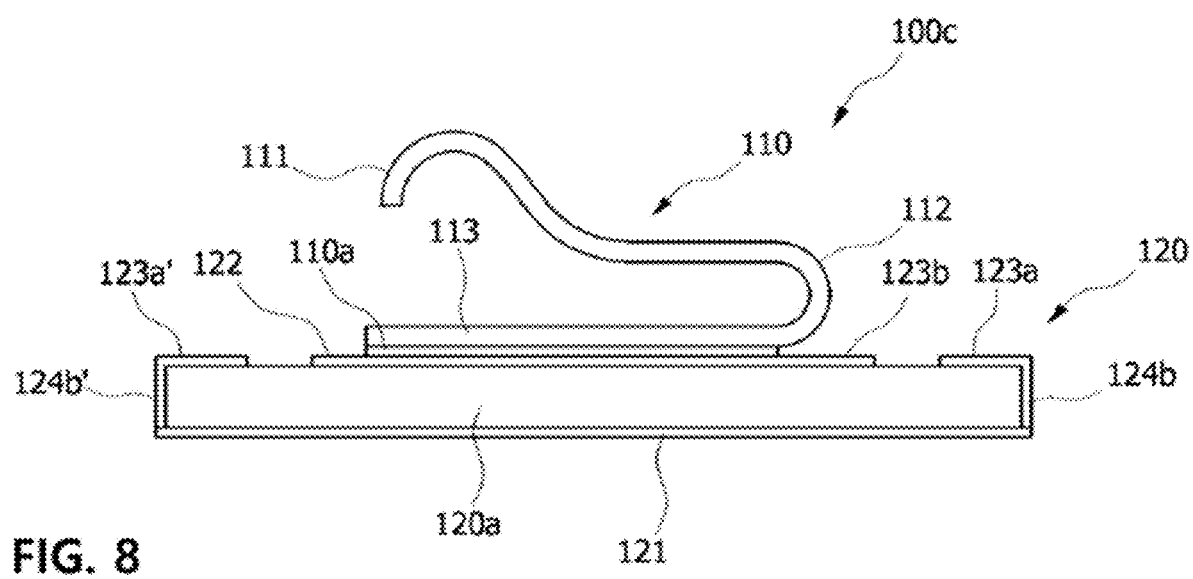
FIG. 8 is a sectional view of the functional contactor according to the embodiment of the present invention, in which a connection portion is provided at both sides of the functional contactor.

As described above, when the connection portion 124b is provided in the form of the side electrode, the first test electrodes 123a and 123a' of the functional contactor 100c may be provided symmetrically on both sides of the second electrode 122 on the upper surface of the functional element 120 as shown in FIG. 8. In this case, one first test electrode 123a may be integrally formed with one connection portion 124b, and the other first test electrode 123a' may be integrally formed with the other connection portion 124b'.

In this manner, when the first test electrodes 123a and 123a' are provided symmetrically on both sides of the functional element 120, the elastic conductor 110 is positioned at the center of the functional element 120 between the first test electrode 123a and 123a' so that the stability can be improved and the alignment can be facilitated.

In this case, the first test electrodes 123a and 123a' and the connection portions 124b and 124b may be integrally formed with the first electrode 121.

Meanwhile, the functional element 120 may have a function for protecting a user or an internal circuit. As an example, the functional element 120 may include at least one of an electric shock protection device, a varistor, a suppressor, a diode, and a capacitor.

That is, the functional element 120 can block the leakage current of the external power source introduced into the conductor from the ground of the circuit board. In this case, the functional element 120 may be configured such that a breakdown voltage Vbr or a withstanding voltage thereof is larger than a rated voltage of the external power source supply of the electronic device. The rated voltage may be a standard rated voltage for each country, for example, one of 240 V, 110 V, 220 V, 120 V, and 100 V.

When the external conductor 14 has an antenna function, the first electrode 121 and the second electrode 122 provided on the upper surface and the lower surface of the functional element 120 may serve as capacitors so that the communication signal introduced from the conductor or the circuit board may be transmitted and the leakage current of the external power source can be blocked.

Further, the functional element 120 can discharge static electricity introduced from the external conductor 14. In this case, the functional element 120 may be configured such that a breakdown voltage Vbr thereof is smaller than an insulation breakdown voltage Vcp of a body 120a provided between the first electrode 121 and the second electrode 122.

Accordingly, the functional contactor 100 can transmit or discharge the communication signal and the static electricity by electrically connecting the external conductor 14 to the circuit board while preventing the leakage current of the external power source introduced from the circuit board from being transferred to the external conductor 14.

Figure 9:
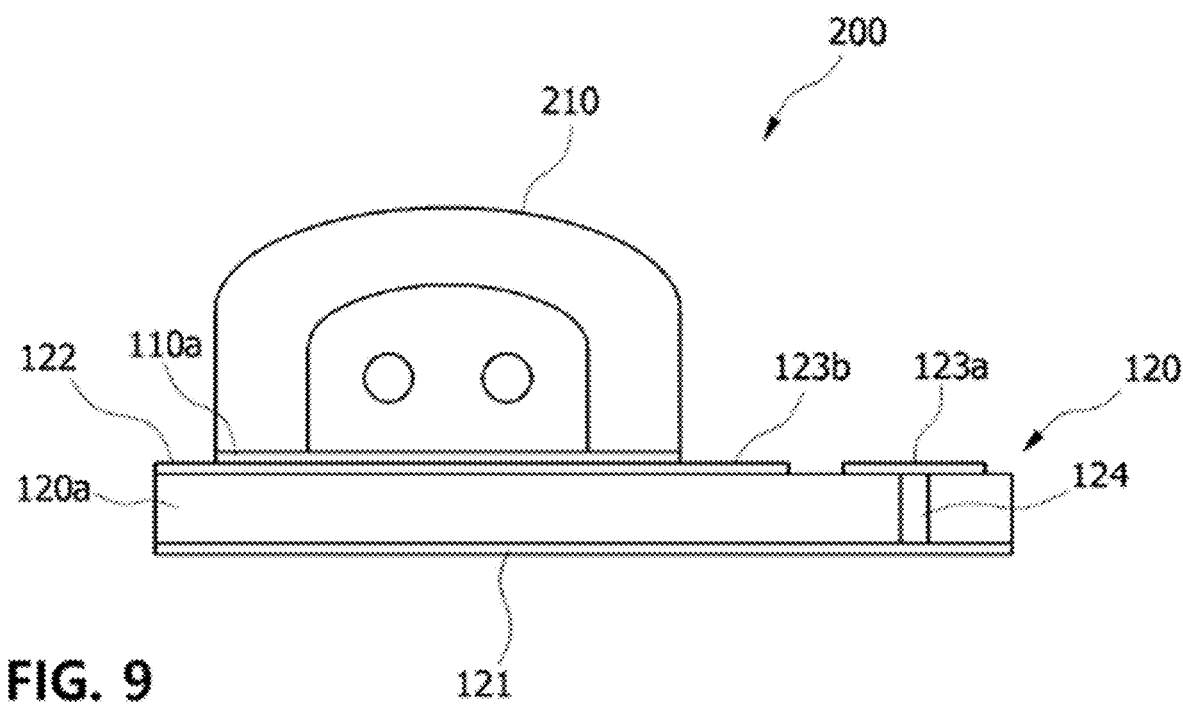
FIG. 9 is a sectional view of the functional contactor according to the embodiment of the present invention, in which a connection portion is provided in the form of an electrode when an elastic conductor is a gasket.

Meanwhile, as shown in FIG. 9, the contactor 200 may include a conductive gasket 210 as the elastic conductor. In this case, the conductive gasket 210 may be integrally formed using a conductive material having elasticity.

The conductive gasket 210 may include at least one of a polymer body, a natural rubber, a sponge, a synthetic rubber, a heat-resistant silicone rubber, and a tube, which are formed by thermally compressing a conductive paste. The conductive gasket is not limited to the above and may include a conductive material having elasticity.

Similarly to FIG. 1, one side of the conductive gasket 210 may come into surface-contact with the internal conductor 12, and the other side of the conductive gasket 210 may be electrically connected to the functional element 120. In this case, the gasket 210 may be compressed toward the external conductor 14 by the pressing force of the internal conductor 12, and the gasket 210 may return to its original state due to the elasticity thereof when the internal conductor 12 is separated from the external conductor 14.

In addition, the functional element may be provided in various forms.

Figure 10:
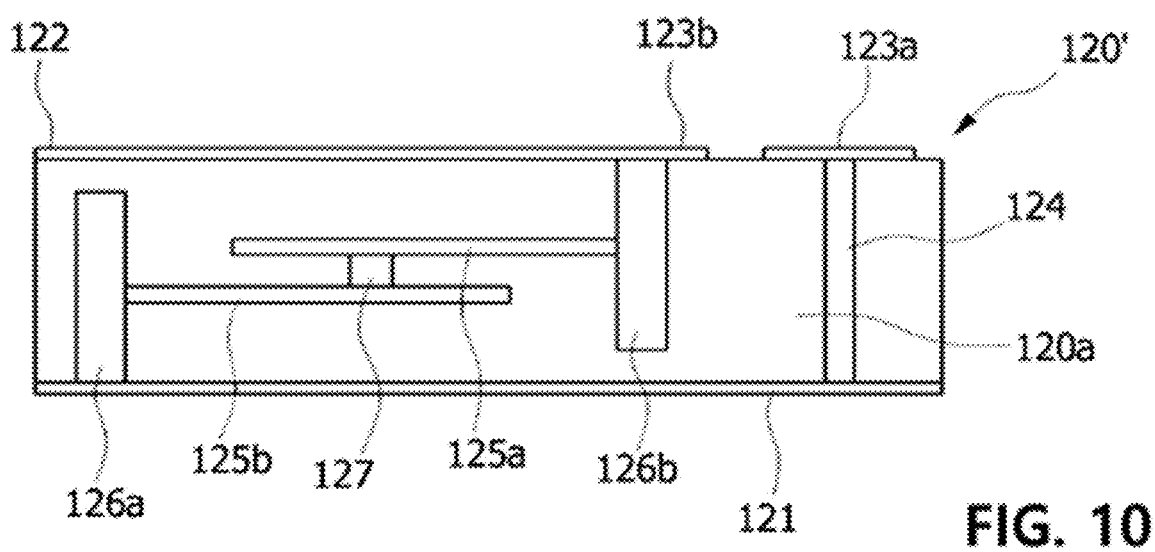
FIG. 10 is a cross-sectional view illustrating an example of a functional element in the functional contactor according to the embodiment of the present invention.
Figure 11:
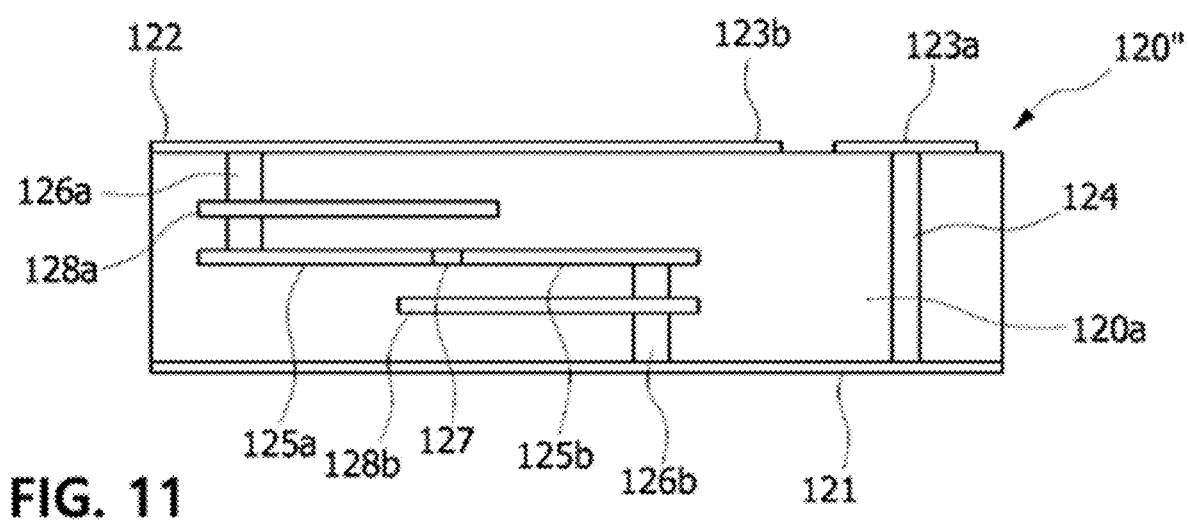
FIG. 11 is a sectional view illustrating another example of the functional element in the functional contactor according to the embodiment of the present invention.

FIGS. 10 and 11 schematically illustrate an example in which the functional element 120 is configured as a suppressor. As shown in FIGS. 10 and 11, according to the present invention, the functional element 120' includes a body 120a and a pair of internal electrodes 125a and 125b which are arranged in the body 120a while being spaced apart from each other at a predetermined interval. The body 120a may be configured as a base body.

In this case, the base body 120a may be integrally formed by performing a pressing process and a firing process after sequentially laminating a plurality of sheet layers such that electrodes provided on one surface of each sheet layer are arranged to be opposed to each other.

The base body 120a may be provided by laminating a plurality of sheet layers and may be formed of an insulating material having a dielectric constant, for example, a ceramic material. In this case, the ceramic material may be a metal-based oxide compound, and the metal-based oxide compound may include at least one selected from $Er_2O_3$, $Dy_2O_3$, $Ho_2O_3$, $V_2O_5$, CoO, $MoO_3$, $SnO_2$, $BaTiO_3$, and $Nd_2O_3$.

In addition, intermediate electrodes 126a and 126b connected to the first electrode 121 and the second electrode 122, respectively, may be provided on both sides of the base body 120a. That is, the intermediate electrode 126a may be connected to the first electrode 121 and the internal electrode 125b, and the intermediate electrode 126b may be connected to the second electrode 122 and the internal electrode 125a.

The pair of internal electrodes 125a and 125b may be formed in the base body 120a while being spaced apart from each other at a predetermined interval and at least one pair of the internal electrodes 125a and 125b may be provided. The internal electrodes 125a and 125b may be vertically opposed to each other.

The internal electrodes 125a and 125b and the intermediate electrodes 126a and 126b may include at least one of Ag, Au, Pt, Pd, Ni, and Cu. In addition, the first electrode 121 and the second electrode 122 may include at least one of Ag, Ni, and Sn.

In this case, the internal electrodes 125a and 125b may have various shapes and patterns. The internal electrodes 125a and 125b may have the same pattern or different patterns. That is, the internal electrodes 125a and 125b are not limited to a specific pattern when some parts of the internal electrodes 125a and 125b overlap each other while facing each other when the base body is formed.

The interval between the pair of internal electrodes 125a and 125b may be set to satisfy the breakdown voltage Vbr of the functional element 120', for example, the interval may be set to 10 μm to 100 μm.

In this case, a gap 127 may be formed between the pair of internal electrodes 125a and 125b. A discharge material may fill the gap 127. That is, a side wall of the gap 127 may be coated with the discharge material at a predetermined thickness. In addition, the discharge material may fill a space formed in the gap 127.

The discharge material is required to have a low dielectric constant, no conductivity, and no short circuiting when an overvoltage is applied thereto.

To this end, the discharge material may be formed of a nonconductive material including at least one kind of metal particles, and may be formed of a semiconductor material containing SiC or a silicon-based component.

For example, when the pair of internal electrodes 125a and 125b include an Ag component, the discharge material may include SiC—ZnO-based components. The SiC (silicon carbide) component represents high thermal stability, high stability in an oxidizing atmosphere, constant conductivity, constant heat conductivity, and a low dielectric constant.

In addition, the ZnO component has high nonlinear resistance and discharge characteristics.

The SiC and ZnO represent conductive properties when used separately. However, when a firing process is performed after mixing the SiC and ZnO, the ZnO is bonded to the surface of the SiC particles, thereby forming an insulating layer having a low conductivity.

In the insulating layer, the SiC is completely reacted so that a SiC—ZnO reaction layer is formed on the surface of the SiC particles. Accordingly, the insulating layer blocks Ag so that a higher insulating property may be imparted to the discharge material and resistance to the static electricity may be improved, thereby solving the DC short phenomenon when the functional element 120' is installed in an electronic component.

Although the example in which the discharge material includes the SiC—ZnO-based material has been described, the present invention is not limited thereto. The discharge material may include a semiconductor material suitable for the components constituting the pair of internal electrodes 125a and 125b or a nonconductive material including metal particles.

Meanwhile, as described above, the functional element 120' of the present invention may serve as a capacitor and may have a communication signal bypass function for bypassing a communication signal.

In addition, as shown in FIG. 11, the pair of internal electrodes 125a and 125b may be disposed to be coplanar in the functional element 120". In this case, the gap 127 is formed between the pair of internal electrodes 125a, and 125b.

Further, at least one capacitor electrode 128a and 128b may be provided to further increase the capacitance of the functional element 120". That is, the functional element 120" may include the suppressor and the capacitor.

In this case, the capacitor electrodes 128a and 128b may be disposed between the first electrode 121 and the second electrode 122 with the internal electrodes 125a and 125b interposed therebetween.

For example, the capacitor electrode 128a may be disposed between the second electrode 122 and the internal electrode 125a and connected to the intermediate electrode 126a, and the capacitor electrode 128b may be disposed between the first electrode 121 and the internal electrode 125b and connected to the intermediate electrode 126b.

Alternatively, although not shown in the drawings, the capacitor electrode 128a may be connected to the intermediate electrode 126b, and the capacitor electrode 128b may be connected to the intermediate electrode 126a. In this case, the intermediate electrodes 126a and 126b may extend upward or downward from the pair of internal electrodes 125a and 125b.

While the present invention has been particularly shown and described with reference to exemplary embodiments thereof, it is to be understood that the present invention is not limited to the disclosed exemplary embodiments. Those skilled in the art may suggest other embodiments by adding, changing, deleting, or modifying the components of the present invention and these changes also fall within the scope of the present invention.

What is claimed is:

1. A functional contactor comprising:
   an elastic conductor configured to come into electrical contact with a conductor of an electronic device;
   a functional element connected to the elastic conductor and having a first electrode and a second electrode on at least portions of a lower surface and an upper surface thereof, respectively;
   a first test electrode connected to the first electrode and spaced apart from the second electrode by a predetermined distance on the upper surface of the functional element; and
   a second test electrode connected to the second electrode and provided on the upper surface of the functional element.

2. The functional contactor of claim 1, further comprising:
   a via hole which perpendicularly passes through the functional element and through which the first test electrode and the first electrode are connected; and
   a conductive material which fills the via hole.

3. The functional contactor of claim 1, further comprising a connection portion provided on at least a portion of a side surface of the functional element to connect the first test electrode and the first electrode.

4. The functional contactor of claim 3, wherein the connection portion is provided in the form of a castellation or an electrode.

5. The functional contactor of claim 3, wherein the connection portion is integrally formed with the first test electrode.

6. The functional contactor of claim 5, wherein the connection portion in the form of the electrode is provided on all of both sides of the functional element, and the first test electrode is provided symmetrically on both sides of the second electrode on the upper surface of the functional element.

7. The functional contactor of claim 1, wherein the second test electrode is at least a portion of the second electrode.

8. The functional contactor of claim 1, wherein the elastic conductor is laminated on the second electrode through a conductive adhesive layer or a solder.

9. The functional contactor of claim 1, wherein the functional element is coupled to a receiving portion of the conductor of the electronic device through a conductive adhesive layer.

10. The functional contactor of claim 1, wherein the elastic conductor includes one of a conductive gasket, a silicone rubber pad, and a C-clip.

11. The functional contactor of claim 1, wherein the functional element has at least one of an electric shock prevention function for blocking a leakage current of an external power source introduced from a ground of a circuit board of the electronic device, a communication signal transmission function for transmitting a communication signal introduced from the conductor or the circuit board of the electronic device, and an electrostatic discharge (ESD) protection function for discharging static electricity introduced from the conductor of the electronic device.

12. A portable electronic device comprising:
    an external conductor contactable with a human body;
    an internal conductor; and
    a functional contactor according to claim 1, wherein the functional contactor is coupled to one of the external conductor and the internal conductor and is connected in series between the external conductor and the internal conductor.

13. The portable electronic device of claim 12, wherein one of the external conductor and the internal conductor coupled to the functional contactor includes a receiving portion for receiving the functional contactor.

14. The portable electronic device of claim 12, wherein the external conductor includes one of an antenna for making communication between the electronic device and an external device, a metal case, and a conductive accessory.

15. The portable electronic device of claim 12, wherein the internal conductor includes a conductive bracket or a circuit board.

* * * * *